United States Patent
Mizoguchi et al.

(10) Patent No.: US 9,466,905 B2
(45) Date of Patent: Oct. 11, 2016

(54) CONNECTOR STRUCTURE, FEMALE CONNECTOR, AND MALE CONNECTOR

(71) Applicant: ASAHI DENKA KENKYUSHO CO., LTD., Nerima-ku (JP)

(72) Inventors: Masanori Mizoguchi, Nerima-ku (JP); Ryu Maeda, Fuchu (JP)

(73) Assignee: ASAHI DENKA KENKYUSHO CO., LTD., Nerima-ku (JP)

( * ) Notice: Subject to any disclaimer, the term of this patent is extended or adjusted under 35 U.S.C. 154(b) by 0 days.

(21) Appl. No.: 14/438,101

(22) PCT Filed: Oct. 24, 2013

(86) PCT No.: PCT/JP2013/078824
§ 371 (c)(1),
(2) Date: Apr. 23, 2015

(87) PCT Pub. No.: WO2014/069327
PCT Pub. Date: May 8, 2014

(65) Prior Publication Data
US 2015/0295334 A1 Oct. 15, 2015

(30) Foreign Application Priority Data
Oct. 29, 2012 (JP) .................................. 2012-237502

(51) Int. Cl.
*H01R 12/62* (2011.01)
*H01R 13/03* (2006.01)
(Continued)

(52) U.S. Cl.
CPC .............. *H01R 13/03* (2013.01); *H01R 12/62* (2013.01); *H01R 12/71* (2013.01); *H01R 12/77* (2013.01);
(Continued)

(58) Field of Classification Search
CPC ........................... H01R 12/79; H01R 12/7082
See application file for complete search history.

(56) References Cited

U.S. PATENT DOCUMENTS 8,267,700 B2  9/2012  Mizoguchi
2009/0233465 A1  9/2009  Mizoguchi
(Continued)

FOREIGN PATENT DOCUMENTS

JP        4059522 B1       3/2008
JP        2011-134681 A    7/2011
(Continued)

OTHER PUBLICATIONS

International Search Report issued Dec. 24, 2013 in PCT/JP2013/078824 filed Oct. 24, 2013.

*Primary Examiner* — James Harvey
(74) *Attorney, Agent, or Firm* — Oblon, McClelland, Maier & Neustadt, L.L.P.

(57) ABSTRACT

A device including male and female connectors each including mounting pad terminals arranged on both side portions of a surface mounted on a circuit board, and a connector structure. The female connector includes: an insulating film; pad portions formed on one surface of the insulating film; a metal guide member fixedly disposed to cover the other surface of the insulating film and insulatingly coated; female terminal portions including slit openings penetrating in a thickness direction through the pad portions and portions of the insulating film; through-holes penetrating through the metal guide member; and mounting pad terminals formed on both side portions of the other surface of the insulating film, with surfaces projecting more than a surface of the metal guide member and electrically connected to the pad portions respectively. The connector structure includes male terminal portions inserted to the slit openings from the female connector's one surface side.

11 Claims, 10 Drawing Sheets

(51) Int. Cl.
*H01R 12/79* (2011.01)
*H05K 1/14* (2006.01)
*H05K 3/34* (2006.01)
*H01R 12/71* (2011.01)
*H01R 12/77* (2011.01)

(52) U.S. Cl.
CPC .............. *H01R 12/79* (2013.01); *H05K 1/147* (2013.01); *H05K 3/341* (2013.01); *H05K 2201/10189* (2013.01); *Y02P 70/613* (2015.11)

(56) References Cited

U.S. PATENT DOCUMENTS

| | | |
|---|---|---|
| 2011/0039427 A1 | 2/2011 | Mizoguchi |
| 2012/0149246 A1 | 6/2012 | Iida et al. |
| 2012/0270423 A1 | 10/2012 | Iida |
| 2013/0065417 A1* | 3/2013 | Kurachi ................. H01R 12/79 439/325 |
| 2014/0017953 A1* | 1/2014 | Iwano .................. H01R 12/777 439/660 |
| 2014/0057497 A1* | 2/2014 | Fukui ....................... H01R 4/48 439/660 |
| 2015/0295334 A1* | 10/2015 | Mizoguchi ............ H05K 1/147 439/626 |

FOREIGN PATENT DOCUMENTS

| | | |
|---|---|---|
| JP | 2012-059421 A | 3/2012 |
| JP | 2012-124040 A | 6/2012 |
| WO | 2010/047141 A1 | 4/2010 |

\* cited by examiner

CONNECTOR STRUCTURE, FEMALE CONNECTOR, AND MALE CONNECTOR

TECHNICAL FIELD

The present invention relates to a novel connector structure, and in particular to a connector structure which realizes great reduction of width and height and in which a retaining force between a male connector and a female connector is properly ensured, as compared with a conventional connector structure constructed by assembling a male connector and a female connector whose output/input terminals are drawn out like centipede legs and which are entirely resin-sealed, and a male connector and a female connector which form the connector structure, the male connector and the female connector having a novel structure enabling a smooth work when they are solder-mounted on a rigid circuit board or a flexible circuit board.

BACKGROUND ART

In accordance with the progress of downsizing, thinning, multi-functioning, and weight reduction of various electric/electronic apparatuses, various kinds of components mounted on circuit boards assembled in these apparatuses are also increasingly required to be downsized and thinned. This has also increased a demand for downsizing (space saving) and thinning (height reduction) of connector structures which are interconnection points for electrically connecting the circuit boards to one another and the components to one another.

Conventionally, a main type of female connectors and male connectors, especially, of the female connectors was a two-row type which was manufactured by punching a thin metal plate material into a predetermined shape in a die to form two rows of female terminal portions on both end portions of its surface along a longitudinal direction, drawing out output/input terminals sideways like centipede legs from the respective female terminal portions, and resin-sealing the whole structure. By solder-mounting the output/input terminals of this female connector on pads of a predetermined circuit board and assembling a male connector being a mating member to the female connector, an intended connector structure was formed.

However, in the case of the conventional connector structure formed by this method, it was difficult to reduce a height of connection portions of the both connectors to 1.0 mm or less, and it was also difficult to narrow a pitch (interval) between the output/input terminals to 0.4 mm or less, and therefore, this structure has confronted a limit in terms of further space saving and height reduction of the connector structure.

In order to solve such a problem, there has been proposed a connector structure in which a flexible circuit board is used as a base, and by applying a plating technique, a photolithography technique, and an etching technique, a female connector in which female terminal portions constituted by, for example, slit openings are arranged in matrix is integrally formed on the flexible circuit board, a male connector having bump-shaped male terminal portions plated with, for example, copper is similarly formed on a flexible circuit board, and the male terminal portions are inserted to the female terminal portions to assemble the both connectors (refer to Patent Literature 1).

There has also been proposed a connector structure in which, by applying a plating technique, a photolithography technique, and an etching technique, a single female connector having a structure in which female terminal portions are arranged in matrix is manufactured on an insulating film, a single male connector having a structure in which male terminal portions are arranged in matrix is similarly manufactured on an insulating film, and the both are assembled. In this case, the female connector and the male connector are both mounted, with predetermined portions located on rear surfaces of the female terminal portions and the male terminal portions being soldered to pads of circuit boards on which the both connectors are mounted respectively, and these portions function as output/input terminal portions of the respective circuit boards (refer to Patent Literature 2).

In the cases of the connector structures disclosed by these Patent Literatures, as compared with the conventional two-row type connector structure, space saving is greatly realized since the connection portions of the both connectors are arranged in matrix, and height reduction is also realized since the thin insulating films are used as base materials. Further, it is also possible to meet the requirement for multi-functioning of components since the number of pins of the connection portions can be increased while space saving is ensured.

The core techniques disclosed by these Patent Literatures lie in that the female terminal portions of the female connector are constituted by the slit openings formed in pad portions composed of the thin insulating film having flexibility and a metal material covering its surface, and the male terminal portions are inserted to the slit openings, whereby the male terminal portions are retained by elasticity of the insulating film and the metal material, and at the same time, electric conductive structures are formed.

PRIOR ART LITERATURE

Patent Literature

Patent Literature 1: Japanese Patent No. 4059522
Patent Literature 2: WO2010/047141

DISCLOSURE OF THE INVENTION

Problems to be Solved by the Invention

The above-described connector structures of the prior arts exhibit excellent performance in terms of the entire space saving and height reduction of the connection portions of the male connector and the female connector. However, in other respects, they have the following problems.

Firstly, in the case of the male connector and the female connector in the connector structure of the above-described Patent Literature 2, they are both actually used, with their output/input terminal portions being solder-mounted on the pads formed on the surfaces of the predetermined circuit boards. Further, the output/input terminal portions of the both connectors are formed in matrix on the whole surfaces opposite the surfaces on which the male terminal portions and the female terminal portions are formed. Therefore, when these output/input terminal portions of these connectors are mounted on the pads of the circuit boards by soldering, their mounted portions are located on the whole rear surfaces of these connectors.

Therefore, in the case of this connector structure, at the time of a solder mounting work of the connectors onto the circuit boards, regarding the mounted portions located on rear surface center portions of the connectors, it is very difficult to visually evaluate the determination on whether or not solder fillets are properly formed there and a proper mounting state is realized. In this respect, this connector structure involves an inconvenient problem that workability of the mounting work lowers or mounting reliability deteriorates.

Further, in the case of the connector structure of Patent Literature 2, when an inserting and pulling operation of the male connector to/from the female connector is repeated, elasticity of the female terminal portions gradually reduces and their retaining force for the male terminal portions lowers, and accordingly the both connectors sometimes separate from each other when receiving an external impact, for instance. Then, in accordance with the reduction of the retaining force, contact resistance between the both terminal portions sometimes increases.

Further, having a very small shape and being very thin, this connector structure has a problem that the work of assembling the both connectors becomes a careful and complicated work.

It is an object of the present invention to provide a connector structure composed of a female connector and a male connector, the connector structure being structured in such a manner that connection structures (conductive structures) of male terminal portions and female terminal portions in the connector structures of the aforesaid prior arts are maintained, and at the same time, in order to solve the aforesaid problem at the time of the solder mounting, output/input terminal portions are arranged as mounting pad terminals on both side portions of rear surfaces of both the male connector and the female connector instead of arranging them in matrix on the whole rear surfaces of the connectors and without forming them on center portions of the rear surfaces, thereby making it possible for a worker to visually confirm mounted portions when the male connector and the female connector are solder-mounted on circuit boards, and to provide a suitable female connector and a suitable male connector using the connector structure.

It is another object of the present invention to provide a connector structure in which pad portions of a female connector are formed of a high-strength, high-elasticity metal material and at the same time, the shape of male terminal portions of a male connector is made suitable, and accordingly when the female connector and the male connector are assembled, male terminal portions are firmly retained by female terminal portions at connection portions of the both terminal portions, and therefore, an increase of contact resistance between the both terminal portions is suppressed, and to provide a suitable female connector and a suitable male connector using the connector structure.

It is still another object of the present invention to provide a connector structure which makes it possible to surely perform an assembling work of a female connector and a male connector at the time of the assembling work of the both and to enhance workability of this work, and to provide a suitable female connector and a suitable male connector using the connector structure.

Means for Solving the Problem

In order to achieve the aforesaid objects, according to the present invention, there is provided a connector structure including:

a male connector having an insulating film having flexibility, male terminal portions constituted by projecting bumps projectingly provided on one surface of the insulating film, a metal guide member fixedly disposed so as to cover the other surface of the insulating film and insulatingly coated, and mounting pad terminals which are formed on both side portions of the other surface of the insulating film, whose surfaces project more than a surface of the metal guide member, and whose base portions are electrically connected to the male terminal portions respectively; and a female connector having an insulating film having flexibility, pad portions formed on one surface of the insulating film, a metal guide member fixedly disposed so as to cover the other surface of the insulating film and insulatingly coated, female terminal portions constituted by slit openings which are formed so as to penetrate in a thickness direction through the pad portions and portions, of the insulating film, where the pad portions are located, through-holes each having a sectional area covering the female terminal portion and formed so as to penetrate through the metal guide member in the thickness direction, and mounting pad terminals which are formed on both side portions of the other surface of the insulating film, whose surfaces project more than a surface of the metal guide member, and whose base portions are electrically connected to the female terminal portions respectively, wherein the male terminal portions of the male connector are inserted to the female terminal portions of the female connector when in use.

In this case, it is suitable that the male terminal portions of the male connector or/and the female terminal portions of the female connector are formed so as to be arranged in two rows or in a zigzag pattern along a longitudinal direction of the insulating film(s).

Further, it is suitable that the mounting pad terminals of the male connector or/and the mounting pad terminals of the female connector are formed so as to project in a comb-teeth shape from the both sides of the insulating film(s).

Further, it is suitable that the pad portions of the female connector are formed of a metal material whose retaining force when the male terminal portions of the male connector are inserted to the female terminal portions exhibits a value of 50% or more of an initial value even after an inserting and pulling operation is repeated 100 times, and it is suitable that, on longitudinal both ends of one of the female connector and the male connector, engaging guide members for positioning when the both connectors are assembled are projectingly provided, and on longitudinal both ends of the other connector, cutout guide portions or through-hole guide portions capable of being fit to the engaging guide members are formed, and furthermore, it is suitable that middle portions of the male terminal portions are in a constricted shape.

Further, according to the present invention, there is provided a female connector including: an insulating film having flexibility; pad portions formed on one surface of the insulating film; a metal guide member fixedly disposed so as to cover the other surface of the insulating film and insulatingly coated; female terminal portions constituted by slit openings formed so as to penetrate in a thickness direction through the pad portions and portions, of the insulating film, on which the pad portions are located; through-holes each having a sectional area covering the female terminal portion and formed so as to penetrate through the metal guide member in the thickness direction; and mounting pad terminals which are formed on both side portions of the other surface of the insulating film, whose surfaces project more than a surface of the metal guide member, and whose base portions are electrically connected to the female terminal portions respectively, wherein male terminal portions of a male connector being an assembly mate are inserted to the female terminal portions when in use.

In this case, it is suitable that the female terminal portions are formed so as to be arranged in two rows or in a zigzag pattern along a longitudinal direction of the insulating film, and it is suitable that the mounting pad terminals are formed so as to project in a comb-teeth shape from the both sides of the insulating film. Further, it is suitable that the pad portions are formed of a metal material whose retaining force when the male terminal portions are inserted to the female terminal portions exhibits a value of 50% or more of an initial value even after an inserting and pulling operation is repeated 100 times.

Further, according to the present invention, there is provided a male connector including: an insulating film having flexibility; male terminal portions constituted by projecting bumps projectingly provided on one surface of the insulating film; a metal guide member fixedly disposed so as to cover the other surface of the insulating film and insulatingly coated; and mounting pad terminals which are formed on both side portions of the other surface of the insulating film, whose surface project more than a surface of the metal guide member, and whose base portions are electrically connected to the male terminal portions respectively, wherein the male terminal portions are inserted to female terminal portions of a female connector being an assembly mate when in use.

In this case, it is suitable that the male terminal portions are formed so as to be arranged in two rows or in a zigzag pattern along a longitudinal direction of the insulating film, and it is suitable that the mounting pad terminals are formed so as to project in a comb-teeth shape from the both sides of the insulating film. Further, it is suitable that middle portions of the male terminal portions are in a constricted shape.

Effects of the Invention

Firstly, in the case of the connector structure of the present invention, in each of the used male connector and female connector, the mounting pad terminals for solder mounting it on a predetermined circuit board are not formed on the center portion of the rear surface (that is, a mounted-side surface) of the connector and are formed on both side portions of the rear surface so as to be arranged, preferably, in the state of projecting in the comb-teeth shape, for instance, and therefore, at the time of the solder mounting, a worker can visually confirm with ease whether or not solder fillets are properly formed on the mounted portions, and can inspect this by an existing inspection device.

Further, the male connector and the female connector in the connector structure of the present invention are both manufactured by applying a photolithography technique, an etching technique, and a plating technique to the very thin insulating films, as in the arts of the aforesaid Patent Literatures, and therefore, space saving and height reduction are realized. For example, as compared with a conventional connector structure of a two-row type which has 25 pins per one row and totally 50 pins and which is of a resin-sealed type whose output/input terminal portions are formed like centipede legs, the connector structure of the two-row type with the same number of pins can realize a great width reduction and as a whole can achieve 50% space saving or more. Further, in the connection portions of the male terminal portions and the female terminal portions, 30% height reduction or more can be realized.

Further, since the pad portions of the female connector are formed of the high-strength, high elasticity metal material, elasticity of the pad portions does not easily deteriorate even after an inserting and pulling operation of the male terminal portions is repeated, which suppresses reduction of the retaining force for the male terminal portions and at the same time suppresses an increase of contact resistance between the both terminal portions. At this time, forming the middle portions of the male terminal portions in the constricted shape multiplies the aforesaid effects.

Furthermore, at the longitudinal both ends of one of the connectors, the engaging guide portions are projectingly provided, and at the both ends of the other connector, the cutout guide portions or the through-hole guide portions fit to the engaging guide portions are formed, and therefore, at the time of the assembly of the both connectors, by fitting the projecting engaging guide portions into the cutout guide portions or the through-hole guide portions, it is possible to realize the connection structures of all the terminal portions simultaneously, which greatly improves workability at the time of the assembly.

MODE FOR CARRYING OUT THE INVENTION

First, out of male connectors and female connectors forming the connector structure of the present invention, regarding a male connector C1 whose male terminal portions are arranged in two rows along a longitudinal direction of the connector and a female connector C2 whose female terminal portions are similarly arranged in two rows as in the male connector C1, their basic structures will be described according to the drawings.

First, the male connector C1 will be described.

Figure 1:
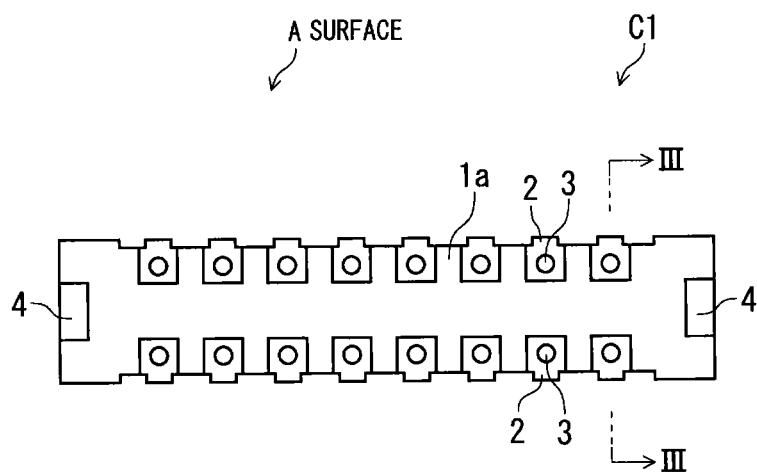
FIG. 1 is a plane view illustrating an example of one surface (A surface) of a male connector C1.
Figure 2:
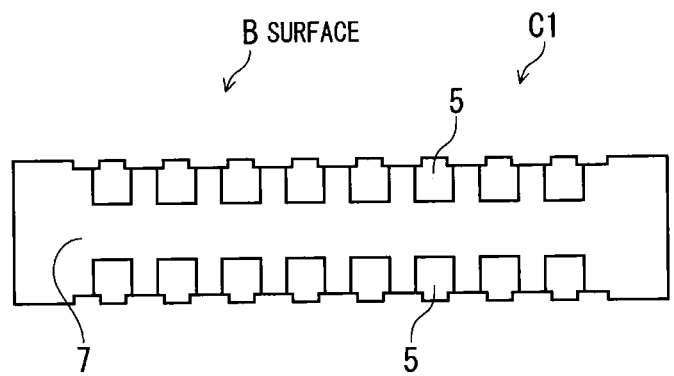
FIG. 2 is a plane view illustrating an example of the other surface (B surface) of the male connector C1.
Figure 3:
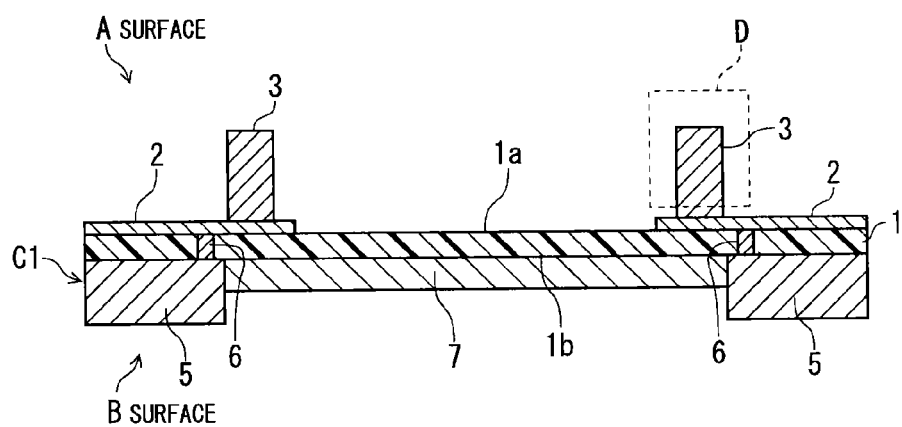
FIG. 3 is a cross-sectional view along III-III line in FIG. 1.

FIG. 1 is a plane view illustrating an example of one surface (hereinafter, referred to as an A surface), on the male connector C1, on which the male terminal portions are projectingly provided, FIG. 2 is a plane view illustrating an example of the other surface (hereinafter, referred to as a B surface) of the male connector C1, and FIG. 3 is a cross-sectional view along III-III line in FIG. 1. Here, the B surface is a rear surface of the male connector C1, and the surface on this side is a mounted-side surface when the male connector C1 is solder-mounted on a predetermined circuit board.

In this male connector C1, an insulating film 1 having flexibility is a base material. As the insulating film 1, a film of insulating resin such as, for example, polyimide, polyester, liquid crystal polymer, or polyetherketone is usable. A polyimide film with a 25 to 50 μm thickness is especially suitable.

On both side portions of an A surface 1a of the insulating film 1, pad portions 2 with a two-row structure having eight pads in one row are formed at predetermined intervals. A shape of the pad portions 2 in a plane view is not limited to a quadrangular shape in FIG. 1, but an appropriate shape such as a circular shape can be selected, and as for their size, they are designed to have an appropriate size in consideration of a relation with an outside diameter of projecting bumps provided upright thereon and the entire area of the male connector C1. Then, on center portions of the pad portions, the projecting bumps 3 formed of, for example, plating copper are projectingly provided. The projecting bumps 3 each preferably have an about 150 to 300 μm height. In this manner, on the A surface 1a of the insulating film 1, the projecting bumps with the two-row structure arranged in its longitudinal direction are formed, and they function as male terminal portions D as will be described later.

It is possible to form these pad portions 2 by forming a plating film of a predetermined material such as, for example, copper on the A surface 1a of the insulating film 1 and applying a photolithography technique and an etching technique to the plating film. Further, they can be also formed by applying the photolithography technique and the etching technique to, for example, a surface copper foil of a commercially available copper-clad insulating film. At this time, by applying the photolithography technique and the etching technique to the pad portions 2, it is also possible to form the projecting bumps 3 at the same time.

Figure 4:
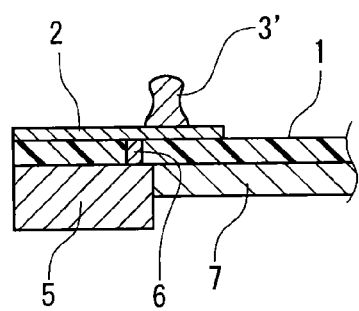
FIG. 4 is a cross-sectional view illustrating a suitable example of a projecting bump (male terminal portion).

Incidentally, forming the projecting bumps 3 as projecting bumps 3' having a shape whose middle portions are constricted as illustrated in FIG. 4 is suitable because this increases a retaining force between female terminal portions of the later-described female connector C2 and the projecting bumps 3' (being the male terminal portions D) when the projecting bumps 3' are inserted to the female terminal portions, suppresses a reduction of the retaining force between the both even after an inserting and pulling operation of the both is repeated, and at the same time, suppresses an increase of contact resistance of the both. When the projecting bumps each have an outside diameter of, for example, about 200 μm, forming constricted portions with a small diameter of about 5 to 20 μm at their middle portions is effective for increasing the aforesaid retaining force. However, a too greatly constricted shape makes a pulling operation in the inserting and pulling operation difficult, and in the extreme case, may break pad portions 8 of the female connector C2, and therefore, the diameter of the constricted portions is preferably smaller than the outside diameter of the whole by about 5 to 20 as described above. Further, applying, for example, a polishing work to tip portions to work the tip portions into a curved shape as illustrated in FIG. 4 is suitable because this enables smooth insertion to the female terminal portions of the female connector C2.

The projecting bumps 3', which are provided upright on the pad portions 2, can be formed by forming projecting bumps having a predetermined outside diameter and height and thereafter applying selective etching to their middle portions to reduce the diameter of these portions while masking their top portions.

Further, on longitudinal both ends of the A surface 1a of the insulating film 1, engaging guide portions 4 for positioning when the later-described female connector C2 is assembled are projectingly provided, as illustrated in FIG. 1. A height of the engaging guide portions 4 is preferably larger than a thickness of the pad portions 2 by about 50 μm. The engaging guide portions 4 can also be formed by applying a photolithography technique and an etching technique to the insulating film 1.

On both side portions of the B surface 1b of the insulating film 1, mounting pad terminals 5 formed of, for example, plating copper and having a predetermined thickness are formed at places corresponding to positions of the projecting bumps 3 which are formed so as to be arranged on the both side portions of the A surface 1a, as illustrated in FIG. 2. Then, base portions of the respective mounting pad terminals 5 are electrically connected to the respective pad portions 2 on the A surface 1a via conductive vias 6 formed in a thickness direction of the insulating film 1, as illustrated in FIG. 3.

These mounting pad terminals 5 are connection portions with solder when the male connector C1 is solder-mounted on a predetermined circuit board and are also output/input terminal portions of the male connector C1.

Incidentally, in view of workability at the time of the solder mounting, it is suitable to form the mounting pad terminals 5 on the both side portions of the B surface 1a of the insulating film 1, and in this case, they are preferably formed in the manner illustrated in FIG. 1 and FIG. 2.

Specifically, in the case of the mounting pad terminals 5 illustrated in FIG. 1 and FIG. 2, portions between the mounting pad terminals have a cutout structure, and the mounting pad terminals 5 are arranged in the longitudinal direction of the insulating film 1 in the manner where their tips project in the comb-teeth shape from the both side portions of the insulating film 1. Forming the mounting pad terminals 5 in such a manner is suitable because this enables a worker to surely visually confirm a soldering connection state between the mounting pad terminals and pads of the circuit board and to perform the inspection by using a conventionally used inspection device, when the male connector C1 is mounted on the predetermined circuit board by soldering.

It is possible to form such a cutout structure by, for example, forming a plating film for the pad portions 2 on the A surface 1a of the insulating film 1, forming a plating film for the mounting pad terminals 5 on the B surface 1b, thereafter first removing only the plating film for the pad portions or the plating film for the mounting pad terminals existing on portions to be cut out by applying the photolithography technique and the etching technique, subsequently removing portions, of the insulating film 1, exposed from these portions by applying, for example, a laser radiation technique, and finally removing the other plating film remaining on the portions to be cut out by etching.

On a surface, in the B surface 1b of the insulating film 1, where the aforesaid mounting pad terminals 5 are not formed, a metal guide member 7 covering the surface and insulatingly coated is fixedly disposed.

A thickness of the metal guide member 7 is preferably set to a thickness smaller than the thickness of the mounting pad terminals 5, for example, about 20 to 100 μm so that surfaces of the mounting pad terminals 5 project more than a surface of the metal guide member 7 by about 10 to 30 μm.

This is because such a structure makes it possible to prevent the metal guide member 7 from getting wet due to the contact with the molten solder when the male connector C1 is solder-mounted on the circuit board.

The metal guide member 7 is fixedly disposed on the insulating film 1 in order to enhance mechanical strength of the whole male connector C1, so as to prevent the occurrence of an assembly failure of the both connectors due to bending or warping of the male connector C1 when the male connector C1 is assembled to the later-described female connector C2.

Further, the entire surface of the metal guide member 7 is insulatingly coated in order to prevent a short circuit accident with the mounting pad terminals 5 disposed adjacently in the same B surface 1b. Concretely, the surface of the metal guide member 7 is coated with insulating resin such as, for example, polyimide resin, epoxy resin, or fluorine resin. Using the polyimide resin is especially suitable because a formed coating film has good electric insulation, can be uniformly formed by electrodeposition, and can be bonded even to a flexible circuit board by using epoxy resin. Incidentally, a metal material forming a base of the metal guide member 7 is not particularly limited, and can be, for example, copper, stainless steel, or the like.

When this metal guide member 7 is fixedly disposed on the B surface 1b, a metal member having the planar shape illustrated in FIG. 2 is manufactured as a separate body by a predetermined metal foil, its entire surface is insulatingly coated, and thereafter, it is pasted on the B surface 1b of the insulating film 1 by using, for example, an adhesive.

Next, based on FIG. 5 to FIG. 7, the female connector C2 assembled to the male connector C1 will be described.

Figure 5:
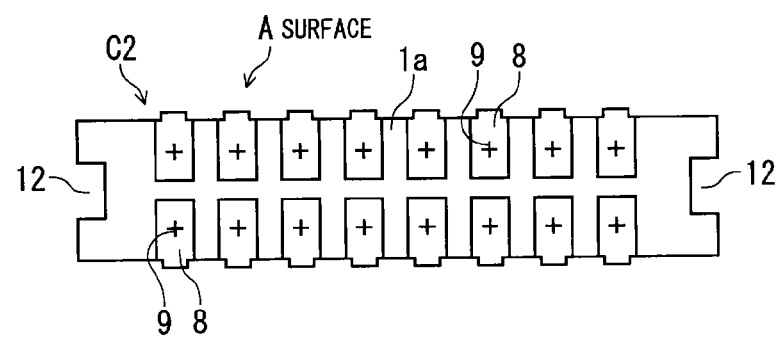
FIG. 5 is a plane view illustrating an example of one surface (A surface) of a female connector C2.
Figure 6:
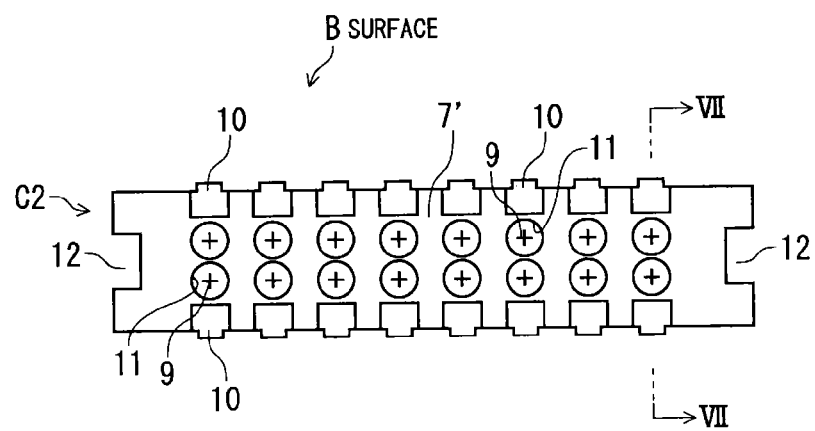
FIG. 6 is a plane view illustrating an example of the other surface (B surface) of the female connector C2.
Figure 7:
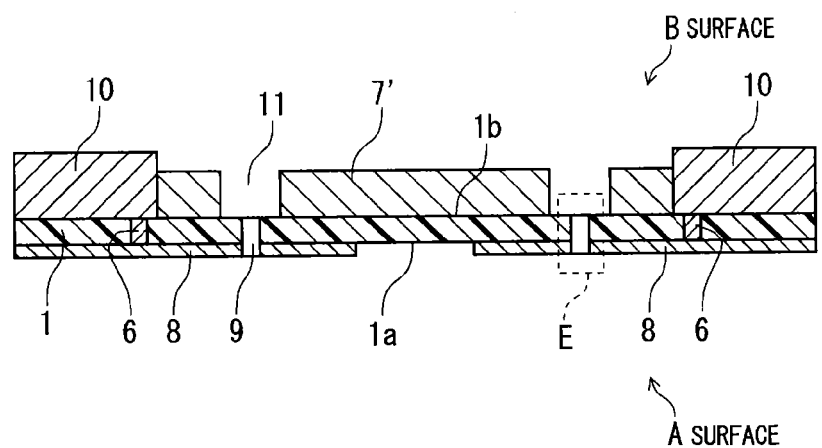
FIG. 7 is a cross-sectional view along VII-VII line in FIG. 6.

FIG. 5 is a plane view illustrating an example of one surface (hereinafter, referred to as an A surface) where the female terminal portions are arranged, FIG. 6 is a plane view illustrating the other surface (hereinafter, referred to as a B surface), and FIG. 7 is a cross-sectional view along VII-VII line in FIG. 6.

In the case of this female connector C2, the male terminal portions arranged on the A surface of the male connector C1 are inserted to female terminal portions arranged on the A surface of the female connector C2, so that the both connectors are assembled.

As a base material of the female connector C2, an insulating film 1 is used as in the above-described case of the male connector C1.

On both side portions of the A surface 1a of the insulating film 1, pad portions 8 are formed along a longitudinal direction of the insulating film 1 at intervals equal to those of the projecting bumps 3 (male terminal portions D) of the male connector C1 being an assembly mate while being arranged in a two-row structure, with one row having eight pad portions. At center portions of the pad portions 8, slit openings 9 in a shape of, for example, a cross are formed so as to penetrate through the pad portions 8 and the insulating film 1. The male terminal portions D (projecting bumps 3) of the male connector C1 are inserted to the slit openings 9 of the pad portions 8 from the A surface side, so that the slit openings 9 function as female terminal portions E.

On each of both side portions of the B surface 1b of the insulating film 1, eight mounting pad terminals 10 are formed at positions corresponding to the pad portions 8 on the A surface, and base portions of the mounting pad terminals 10 are electrically connected to the pad portions 8 on the A surface 1a via conductive vias 6 formed in a thickness direction of the insulating film 1.

Further, in the B surface 1b of the insulating film 1, a surface where the mounting pad terminals 10 are not formed, a metal guide member 7' whose entire surface is insulatingly coated is fixedly disposed as in the above-described case of the male connector C1. Then, in this metal guide member 7', at portions where it is in contact with the slit openings 9, through-holes 11 having a cross-sectional area covering the entire slit openings 9 and penetrating in the thickness direction are formed, and the slit openings 9 formed in the pad portions 8 and the through-holes 11 formed in the metal guide member 7' communicate with each other.

Similarly to the above-described case of the male connector C1, surfaces of the mounting pad terminals 10 also being connection portions when the female connector C2 is solder-mounted on a predetermined circuit board project more than a surface of the metal guide member 7', and a preferable projection amount is about 10 to 30 μm.

Further, as illustrated in FIG. 5 and FIG. 6, in the case of the female connector C2 as well, similarly to the case of the aforesaid male connector C1, portions between the mounting pad terminals 10 have a cutout structure, and tips of the mounting pad terminals 10 are formed in a manner of projecting in a comb-teeth shape from both sides of the insulating film 1. This is because such a structure can improve workability of a mounting work by the worker when the female connector C2 is solder-mounted on the predetermined circuit board.

Further, in the case of the female connector C2, on its longitudinal both ends, cutout guide portions 12 to which the engaging guide portions 4 for positioning projectingly provided on the both ends of the male connector C1 being the assembly mating member can be fit are formed. As long as the shape of the cutout guide portions 12 corresponds to the shape of the engaging guide portions of the mating member and if the engaging guide portions of the mating member are, for example, columnar projections, the cutout guide portions 12 may be guide portions being circular through-holes to which the projections can be fit.

Incidentally, in the case of the connector structure of the present invention, the engaging guide portions 4 of the male connector C1 may be projectingly provided on the female connector C2 and accordingly, the cutout guide portions 12 or the through-hole guide portions of the female connector C2 may be formed on the male connector C1.

Figure 8:
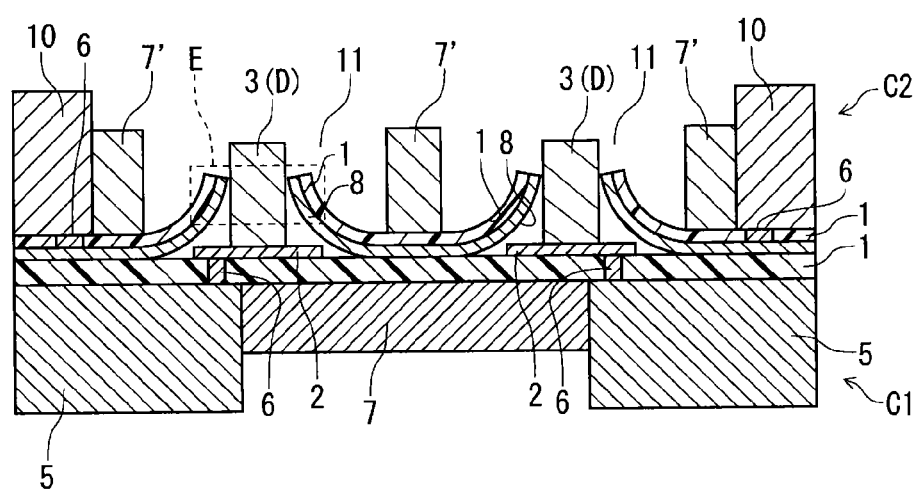
FIG. 8 is a cross-sectional view illustrating a connection structure of female terminal portions and male terminal portions when the male connector C1 is assembled to the female connector C2.

FIG. 8 illustrates a connection structure of the both terminal portions when the aforesaid projecting bumps 3 (male terminal portions D) of the male connector C1 are inserted to the slit openings 9 (female terminal portions E) of the female connector C2, whereby the both connectors are assembled.

When the both connectors are assembled, the projecting bumps 3 inserted to the slit openings 9 are gradually inserted toward the through-holes 11 while pushing out the slit openings. At this time, the slit openings 9 bend in an insertion direction of the projecting bumps 3. Therefore, since a restoring force is generated in the pad portions 8 and the insulating film 1 in which the slit openings 9 are formed, the surfaces of the pad portions 8 come into pressure contact with the middle portions of the projecting bumps 3, so that the projecting bumps 3 are retained here by the restoring force of the slit openings 9 and at the same time, conductive structures are formed between the both connectors.

Incidentally, as is apparent from FIG. 7 and FIG. 8, a thickness of the metal guide member 7' of the female connector C2 is set smaller than a thickness of the mounting pad terminals 10 and also larger than a height of the inserted projecting bumps 3 (male terminal portions D). That is, its thickness is set so that the projecting bumps 3 inserted to the through-holes 11 do not project from an upper surface of the metal guide member 7'.

At the time of the assembly of the both connectors, the slit openings 9 not only function as the female terminal portions E but also function as retaining portions for retaining the male terminal portions D. As the retaining portions, they are preferably retaining portions whose retaining force does not decrease and at the same time which do not cause an increase of contact resistance between the both terminal portions even after the inserting and pulling operation of the male terminal portions D to/from the slit openings 9 is repeated.

In this case, even after the inserting and pulling operation is repeated 100 times, the retaining force preferably exhibits a 50% value or more of the retaining force at the time of the first insertion (initial value). This is because, when such a retaining force is assured in the aforesaid retaining portions, the increase of the contact resistance between the both terminal portions is suppressed and inconvenience that the both connectors separate from each other can be prevented even when, for example, an external impact is given. More preferably, the retaining force after the inserting and pulling operation is repeated 100 times is 65% or more of the initial value.

From these respects, it is preferable that the pad portions 8 of the female connector C2 are formed of a high-strength, high-elasticity metal material. Suitable examples of such a metal material are stainless steel, a copper alloy, an iron alloy, and the like. Stainless steel and a Corson alloy (copper alloy) are especially suitable. Further, the surfaces of the pad portions formed of any of these metal materials may be plated with gold, copper, or the like.

Next, the connector structure in a case where the male connector C1 is solder-mounted on a rigid circuit board and the female connector C2 is solder-mounted on a flexible circuit board will be described.

Figure 9:
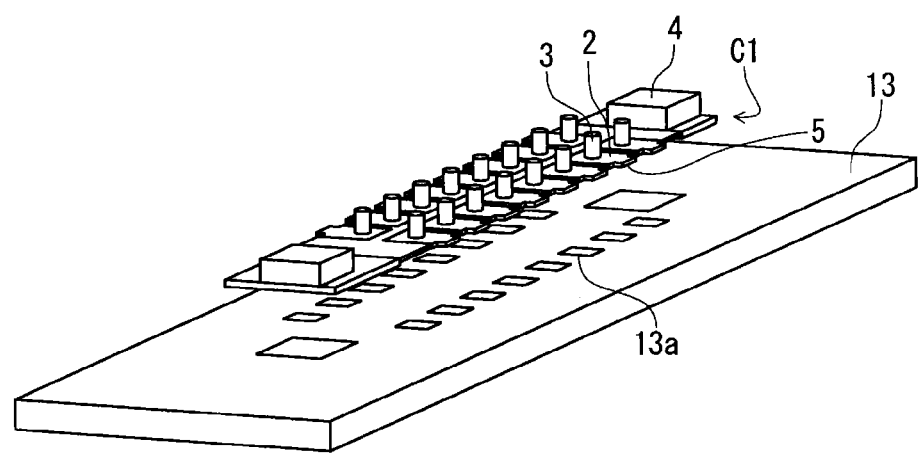
FIG. 9 is a perspective view illustrating a state where the male connector C1 is solder-mounted on a rigid circuit board.
Figure 10:
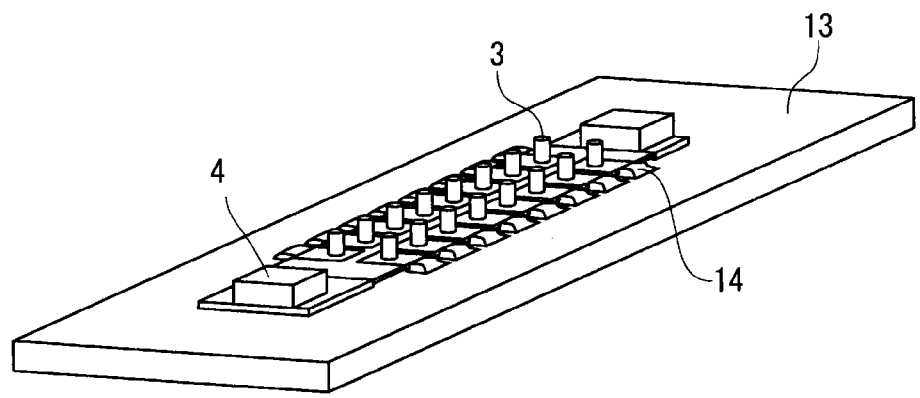
FIG. 10 is a perspective view illustrating a state where solder fillets are formed by the solder mounting.

First, as illustrated in FIG. 9, the male connector C1 is disposed above the rigid circuit board 13 on whose front surface, pads 13a in a predetermined shape are arranged in two rows, and the mounting pad terminals 5 arranged on the rear surface of the male connector C1 and the pads 13a are soldered. As a result, as illustrated in FIG. 10, solder fillets 14 are formed between the mounting pad terminals 5 and the pads 13a, so that the male connector C1 is solder-mounted on the rigid circuit board.

In the course of this soldering work, the metal guide member 7 does not get wet by coming into contact with the molten solder since the thickness of the mounting pad terminals 5 is larger than the thickness of the metal guide member 7. Further, since this soldering work is a soldering work of the mounting pad terminals 5 projecting in the comb-teeth shape from the both sides of the male connector C1 and the pads 13a, the worker can visually confirm a formation state of the solder fillets or can inspect whether the formation state of the solder fillets is good or not by using a conventionally used inspection device.

The female connector C2 is solder-mounted on the flexible circuit board in the same manner. Specifically, the mounting pad terminals 10 projectingly formed in the two-row structure on the B surface of the female connector C2 illustrated in FIG. 7 and pads similarly arranged in the two-row structure on a front surface of the flexible circuit board are soldered, whereby the female connector C2 is mounted thereon. In this case as well, since the mounting pad terminals 10 project sideways in the comb-teeth shape from the both sides of the female connector C2, the worker can visually confirm a formation state of solder fillets.

Figure 11:
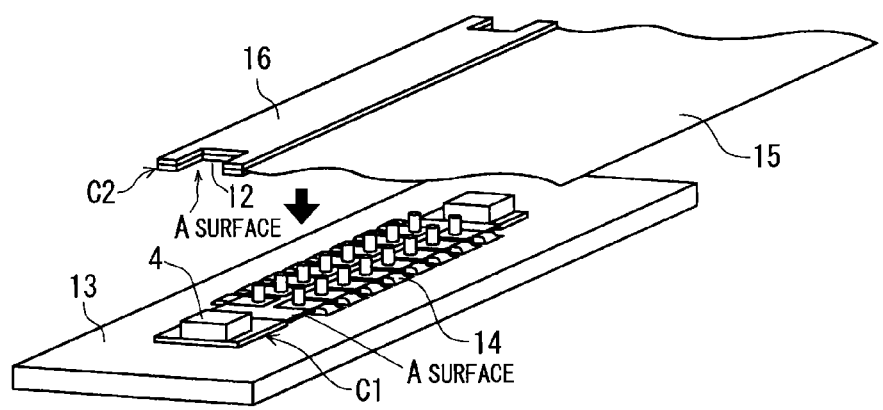
FIG. 11 is a perspective view illustrating a state where the female connector is solder-mounted on a flexible circuit board and the female connector C2 is disposed to face the male connector C1 solder-mounted on the rigid circuit board.

Next, as illustrated in FIG. 11, on a rear surface of the flexible circuit board 15 corresponding to a mounting place where the female connector C is solder-mounted, a reinforcing plate 16 having the same planar shape as that of the mounted female connector C2 is fixedly disposed by using, for example, an adhesive. At this time, portions, of the flexible circuit board, which are exposed from the cutout guide portions 12 formed in the both ends of the female connector C2 (therefore, which are formed also in both ends of the reinforcing plate) are removed by, for example, laser radiation.

In this manner, in an end portion of the flexible circuit board, the female connector C2, the flexible circuit board 15, and the reinforcing plate 16 are integrated while sharing the cutout guide portions 12.

As the reinforcing plate 16, one obtained by processing a stainless steel sheet or a copper alloy sheet by etching or one obtained by patterning a nickel alloy by the combination of a photolithography technique and electroforming may be used, for instance.

Figure 12:
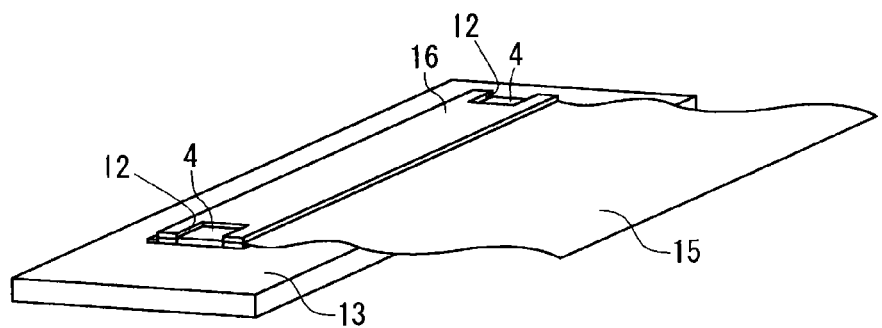
FIG. 12 is a perspective view illustrating an example of a connector structure using the male connector C1 and the female connector C2.

Then, as illustrated in FIG. 11, the A surface of the female connector C2 and the A surface of the male connector C1 are disposed to face each other and the cutout guide portions 12 are fit to the engaging guide portions 4 for positioning projectingly provided on the both ends of the male connector C1. Simultaneously at this time, the projecting bumps 3 of the male connector C1 are inserted to the slit openings 9 of the pads 8 of the female connector C2, so that, as illustrated in FIG. 12, the both connectors are assembled and the connector structure electrically connecting the rigid circuit board 13 and the flexible circuit board 15 is formed.

Next, FIG. 13 to FIG. 16 illustrate a male connector F1 whose male terminal portions are arranged in a zigzag pattern and a female connector F2 which is an assembly mating member of the male connector F1 and whose female terminal portions are similarly arranged in a zigzag pattern.

Figure 13:
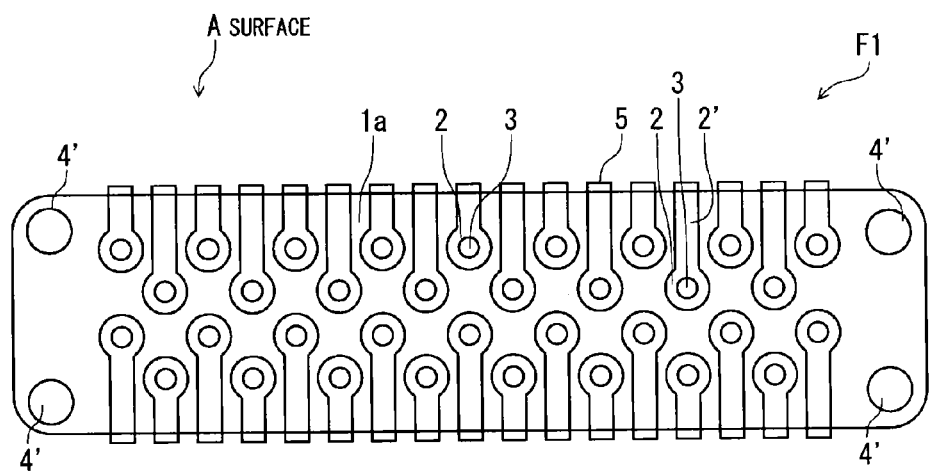
FIG. 13 is a plane view illustrating an example of one surface (A surface) of a male connector F1.
Figure 14:
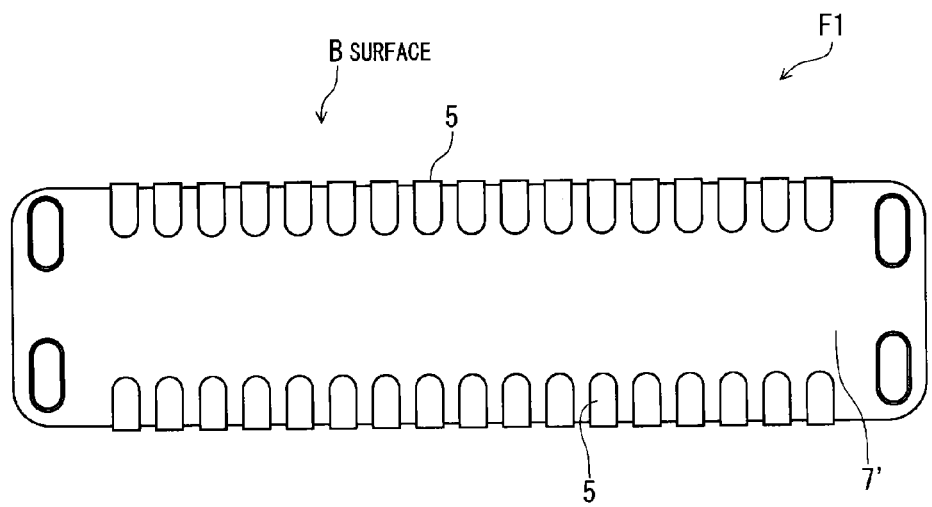
FIG. 14 is a plane view illustrating an example of the other surface (B surface) of the male connector F1.
Figure 15:
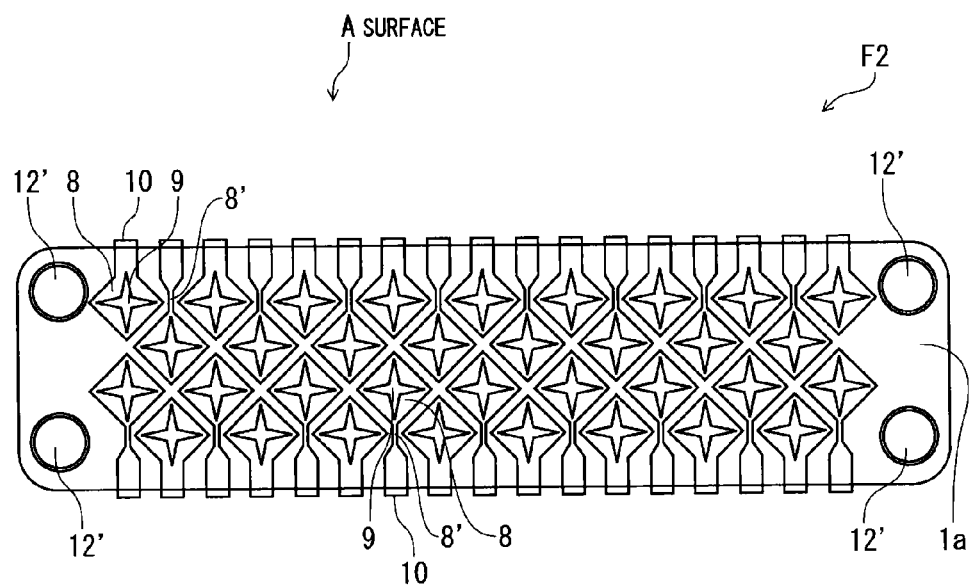
FIG. 15 is a plane view illustrating an example of one surface (A surface) of a female connector F2.
Figure 16:
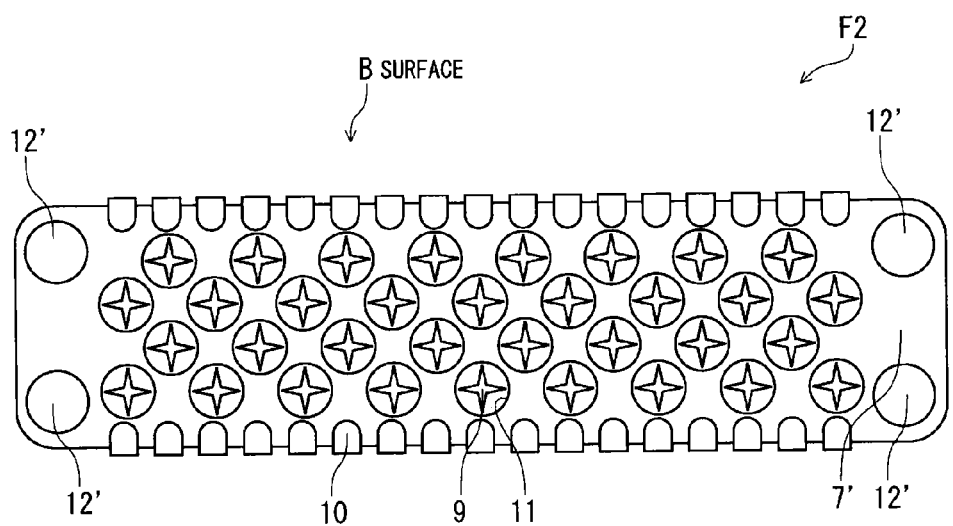
FIG. 16 is a plane view illustrating an example of the other surface (B surface) of the female connector F2.

FIG. 13 is a plane view illustrating an example of one surface (A surface) on which the male terminal portions are projectingly provided in the male connector F1, and FIG. 14 is a plane view illustrating an example of the other surface (B surface) on which mounting pad terminals are formed on both side portions of an insulating film. FIG. 15 is a plane view illustrating an example of one surface (A surface) on which the female terminal portions are arranged in the female connector F2, and FIG. 16 is a plane view illustrating the other surface (B surface) on which mounting pad terminals are formed on both side portions of an insulating film.

In the case of this male connector F1, as is apparent from FIG. 13, the number of projecting bumps 3 (male terminal portions D) arranged in the zigzag pattern and projecting from the A surface is 34 pins. Therefore, the number of pad portions 2 on whose center portions these projecting bumps 3 are provided upright is also 34. Further, in the case of the male connector F1, totally four columnar projections 4' are formed as engaging guide portions at four corners on the both ends, instead of the engaging guide portions 4 for positioning which are formed on the aforesaid male connector C1 so as to be projectingly provided on the longitudinal both ends.

The mounting pad terminals 5, 17 per each side and 34 on both sides, are formed, with their tip portions projecting in a comb-teeth shape from the both side portions of the B surface by about 50 μm, as is apparent from FIG. 14. Similarly to the case of the male connector C1, on the B surface except formation places of the mounting pad terminals, a metal guide member 7' insulatingly coated is fixedly disposed.

In accordance with the formation of the projecting bumps 3 in the zigzag pattern, leads 2' are drawn out up to the both side portions from the respective pad portions 2 arranged in the two-row structure on a center portion of the A surface, as illustrated in FIG. 13, and the leads 2' and the mounting pad terminals 5 arranged on the both side portions of the B surface are electrically connected. In this case, similarly to the case of the male connector C1, base portions of the mounting pad terminals 5 and the aforesaid leads 2' are electrically connected to each other via conductive vias formed in a thickness direction of the insulating film.

In the case of the female connector F2, on its A surface, 34 pad portions 8 are formed in a zigzag pattern corresponding to the arrangement of the projecting bumps 3 in the male connector F1, and slit openings 9 in the shape of a cross are formed as female terminal portions E in the respective pad portions 8, as is apparent from FIG. 15. Further, on longitudinal both ends of the female connector F2, four through-holes 12' capable of being fit to the aforesaid columnar projections (engaging guide portions) 4' of the male connector F1 are formed as through-hole guide portions, instead of the aforesaid cutout guide portions 12 formed in the male connector C2.

As is apparent from FIG. 16, on the both sides of the B surface, the mounting pad terminals 10, 17 per each side and 34 on the both sides, are formed while their tip portions project in a comb-teeth shape sideways from the both sides by about 50 μm, as is apparent from FIG. 16.

Similarly to the case of the female connector C2, on the B surface except formation places of the mounting pad terminals 10, a metal guide member 7' insulatingly coated is fixedly disposed, and in portions where the metal guide member 7' overlap with the slit openings 9, through holes 11 having a cross-sectional area covering the slit openings 9 are formed in a thickness direction of the metal guide member 7', so that the through-holes 11 and the slit openings 9 communicate with each other.

Similarly to the case of the female connector C2, in accordance with the arrangement of the pad portions 8 in the zigzag pattern, leads 8' are drawn out from the respective pad portions 8 arranged in the two-row structure on a center portion of the A surface, and the leads 8' and base portions of the mounting pad terminals 10 arranged on the both side portions of the B surface are electrically connected via conductive vias formed in the thickness direction of the insulating film, as illustrated in FIG. 15.

Here, when the female connector C2 whose female terminal portions are formed in the two-row structure and the above-described female connector F2 whose female terminal portions are formed in the four-row structure as a whole in the zigzag pattern are compared, if, for example, the both connectors are equal in the whole length and width and the number of the female terminal portions formed therein is equal, a planar area of the female terminal portions of the female connector F2 is smaller as compared with the case of the female connector C2.

When the planar area of the female terminal portions is reduced, a plastic deformation amount of the pad portions at portions corresponding to the slit openings becomes large when the projecting bumps (male terminal portions) of the male connector are inserted to the female terminal portions while pushing out the slit openings, which causes a problem that, at an initial stage of the inserting and pulling operation, a retaining force between the both terminal portions is likely to quickly lower, resulting in an increase of contact resistance.

As described above, from the viewpoint of connection reliability between the both terminals, the planar area of the female terminal portions is preferably wider, but this results in an increase of the length and width of the connector and sacrifices space saving.

In this respect, in the case of the female connector F2 illustrated in FIG. 15 and FIG. 16, as compared with the female connector C2 with the two-row structure having the same number 34 of the female terminal portions, the total length is the same, but its width is about 1.6 times and thus wide. However, a diameter of the through-holes 11 in the female terminal portions is about 1.5 times a diameter of the through-holes 11 of the female connector C2, and the female connector F2 is designed so that the plastic deformation of the pad portions 8 becomes smaller than that in the female connector C2. That is, in the case of the female connector F2, it is designed so that connection reliability between the both terminals is enhanced even though space saving is somewhat sacrificed.

The above-described male connector F1, similarly to the case of the male connector C1 of the two-row type illustrated in FIG. 11, is solder-mounted on, for example, a rigid circuit board 13, with the mounting pad terminals 5 on the B surface being soldered to pads of the rigid circuit board 13. Further, the female connector F2, similarly to the case of the female connector C2 of the two-row type illustrated in FIG. 11, is solder-mounted on, for example, a flexible circuit board 15, with the mounting pad terminals 10 on the B surface being soldered to pads of the flexible circuit board 15, and further four through-hole guide portions 12' are formed in the flexible circuit board, and a reinforcing plate 16 is fixedly disposed on a rear surface of the flexible circuit board. Then, the both are assembled.

Figure 17:
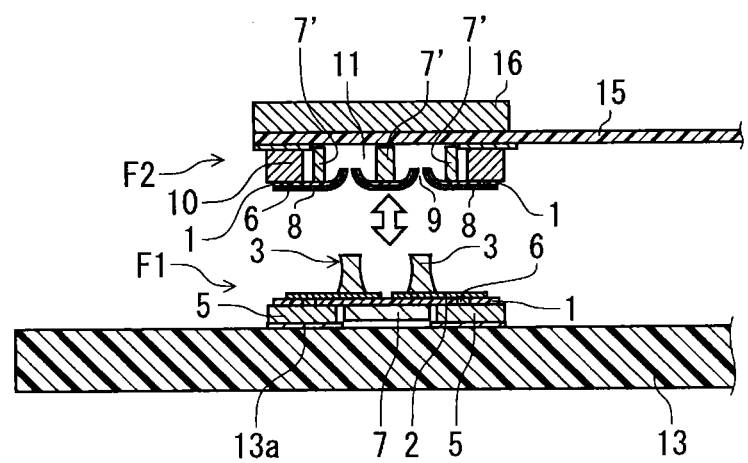
FIG. 17 is a cross-sectional view illustrating a state where the male connector F1 solder-mounted on a rigid circuit board and the female connector F2 solder-mounted on a flexible circuit board are disposed to face each other.

First, as illustrated in FIG. 17, the A surfaces of the both are disposed to face each other, and the four columnar projections 4' projectingly provided on the male connector F1 are fit into the respective four through-holes 12' formed in the female connector F2 and the entire connectors are brought into pressure contact with each other.

Figure 18:
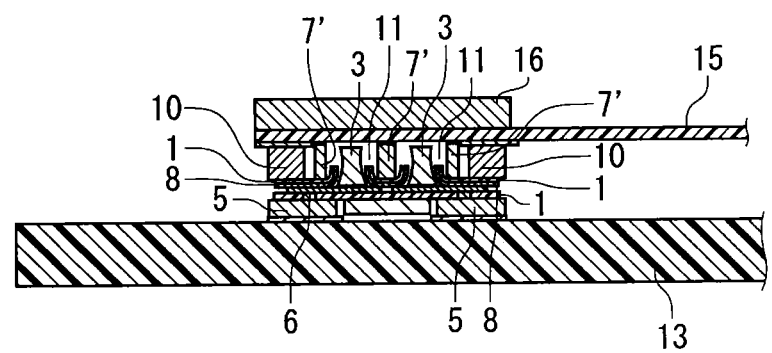
FIG. 18 is a cross-sectional view illustrating an example of a connector structure using the male connector F1 and the female connector F2.

As a result, as illustrated in FIG. 18, the projecting bumps 3 (male terminal portions D) of the male connector F1 are inserted to the through-holes 11 of the metal guide member 7' from the slit openings 9 of the pad portions 8 in the female connector F2, and the connector structure is formed there.

Figure 19:
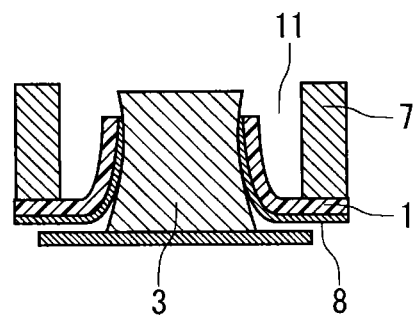
FIG. 19 is a cross-sectional view illustrating a state of plastic deformation of a pad portion when the projecting bump (male terminal portion) is inserted to the female connector C2.
Figure 20:
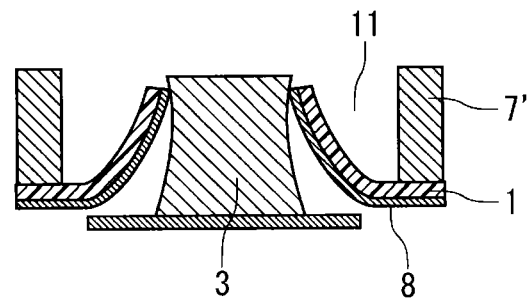
FIG. 20 is a cross-sectional view illustrating a state of plastic deformation of a pad portion when the projecting bump (male terminal portion) is inserted to the female connector F2.

A state of the plastic deformation of the pad portion 8 at this time is illustrated in FIG. 20 in comparison with a state of the plastic deformation of the pad portion 8 of the female connector C2 illustrated in FIG. 19.

As is apparent from these drawings, in the case of the female connector F2, since the planar area of the female terminal portions is large, the plastic deformation of the pad portion 8 is far smaller than the plastic deformation in the female connector C2 whose female terminal portion has a small planar area.

Incidentally, in the above description, the male connector F1 and the female connector F2 of the zigzag type are larger in width as compared with the male connector C1 and the female connector C2 of the two-row type. However, by adjusting the sizes, arrangement intervals, and so on of the pad portions 2 and the projecting bumps 3 (male terminal portions D) in the male connector F1 and the pad portions 8 in the female connector F2, to thereby narrow the arrangement intervals of the pad portions 2, the projecting bumps 3, and the pad portions 8 illustrated in FIG. 13 to FIG. 16, for instance, it is of course possible for the male connector F1 and the female connector F2 to be about equal in width to the male connector C1 and the female connector C2 of the two-row type.

Further, in the above description, the combinations of the male connectors C1, F1 and the female connectors C2, F2 are provided, but only one connector may have the aforesaid structure of the present invention, and it can be combined with a male connector or a female connector of another type using metal bumps or the like. However, it goes without saying that the use of the two-row type connector structure composed of either of the aforesaid combinations of the male connectors C1, F1 and the male connectors C2, F2 of the present invention is more preferable in order to realize thickness reduction, space saving, and height reduction.

EXPLANATION OF REFERENCE SIGNS

C1, F1 male connector
C2, F2 female connector
1 insulating film
1a one surface (A surface) of insulating film 1
1b other surface (B surface) of insulating film 1
2 pad portion
3, 3' projecting bump (male terminal portion D)
4 engaging guide portion for positioning
4' columnar projection for positioning
5 mounting pad terminal
6 conductive via
7, 7' metal guide member
8 pad portion
8' lead from pad portion 8
9 slit opening
10 mounting pad terminal
11 through-hole
12 cutout guide portion
12' through-hole guide portion
13 rigid circuit board
13a pad of rigid circuit board
14 solder fillet
15 flexible circuit board
16 reinforcing plate

The invention claimed is:

1. A connector structure, comprising:
a male connector comprising:
a first insulating film having flexibility,
male terminal portions constituted by projecting bumps provided on one surface of the first insulating film,
a first metal guide member fixedly disposed so as to cover the other surface of the first insulating film and being coated with an insulating material, and
first mounting pad terminals, which are formed on both side portions of the other surface of the first insulating film, whose surfaces project beyond a surface of the first metal guide member, and whose base portions are electrically connected to the male terminal portions, respectively; and
a female connector comprising:
a second insulating film having flexibility,
pad portions formed on one surface of the second insulating film,
a second metal guide member fixedly disposed so as to cover the other surface of the second insulating film and being coated with the insulating material,
female terminal portions constituted by slit openings, which are formed so as to penetrate in a thickness direction through the pad portions and through portions of the second insulating film where the pad portions are located,
through-holes each having a sectional area covering the female terminal portions and formed so as to penetrate through the second metal guide member in the thickness direction, and
second mounting pad terminals, which are formed on both side portions of the other surface of the second insulating film, whose surfaces project beyond a surface of the second metal guide member, and whose base portions are electrically connected to the female terminal portions, respectively,
wherein the male terminal portions of the male connector are inserted into the female terminal portions of the female connector when in use.

2. The connector structure according to claim 1, wherein the male terminal portions of the male connector are formed so as to be arranged in two rows or in a zigzag pattern along a longitudinal direction of the first insulating film.

3. The connector structure according to claim 1, wherein the mounting pad terminals of the male connector are formed so as to project in a comb-teeth shape from both sides of the first insulating film.

4. The connector structure according to claim 1, wherein the female terminal portions of the female connector are formed so as to be arranged in two rows or in a ziazag pattern along a longitudinal direction of the second insulating film.

5. The connector structure according to claim 1, wherein the mounting pad terminals of the female connector are formed so as to project in a comb-teeth shape from both sides of the second insulating film.

6. The connector structure according to claim 1, wherein the pad portions of the female connector are formed of a metal material whose retaining force when the male terminal portions of the male connector are inserted into the female terminal portions exhibits a value of 50% or more of an initial value even after an inserting and pulling operation is repeated 100 times.

7. The connector structure according to claim 6, wherein the metal material is one of stainless steel, a nickel alloy, an iron alloy, and a copper alloy.

8. The connector structure according to claim 1, wherein on both ends of one of the female connector and the male connector, engaging guide portions for positioning when the both connectors are assembled are projectingly provided, and in both ends of the other connector, cutout guide portions or through-hole guide portions configured to fit to the engaging guide portions are formed.

9. The connector structure according to claim 1, wherein middle portions of the male terminal portions of the male connector are in a constricted shape.

10. A female connector, comprising:
an insulating film having flexibility;
pad portions formed on one surface of the insulating film;
a metal guide member fixedly disposed so as to cover the other surface of the insulating film and being coated with an insulating material;
female terminal portions constituted by slit openings formed so as to penetrate in a thickness direction through the pad portions and through portions of the insulating film on which the pad portions are located;
through-holes each having a sectional area covering the female terminal portions and formed so as to penetrate through the metal guide member in the thickness direction; and
mounting pad terminals, which are formed on both side portions of the other surface of the insulating film, whose surfaces project beyond a surface of the metal guide member, and whose base portions are electrically connected to the female terminal portions, respectively,
wherein male terminal portions of a male connector being an assembly mate are inserted into the female terminal portions when in use.

11. A male connector, comprising:
an insulating film having flexibility;
male terminal portions constituted by projecting bumps provided on one surface of the insulating film;
a metal guide member fixedly disposed so as to cover the other surface of the insulating film and being coated with an insulating material; and
mounting pad terminals, which are formed on both side portions of the other surface of the insulating film, whose surfaces project beyond a surface of the metal guide member, and whose base portions are electrically connected to the male terminal portions, respectively,
wherein the male terminal portions are inserted into female terminal portions of a female connector being an assembly mate when in use.

* * * * *